(12) United States Patent
Ning et al.

(10) Patent No.: US 9,287,049 B2
(45) Date of Patent: Mar. 15, 2016

(54) LOW ACOUSTIC NOISE CAPACITORS

(71) Applicant: Apple Inc., Cupertino, CA (US)

(72) Inventors: Gang Ning, Santa Clara, CA (US); Shawn Xavier Arnold, San Jose, CA (US); Jeffrey M. Thoma, Mountain View, CA (US); Henry H. Yang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 113 days.

(21) Appl. No.: 13/872,000

(22) Filed: Apr. 26, 2013

(65) Prior Publication Data

US 2014/0218841 A1   Aug. 7, 2014

Related U.S. Application Data

(60) Provisional application No. 61/759,935, filed on Feb. 1, 2013.

(51) Int. Cl.
| | |
|---|---|
| *H01G 4/35* | (2006.01) |
| *H01G 4/30* | (2006.01) |
| *H01G 4/232* | (2006.01) |
| *H05K 3/34* | (2006.01) |

(52) U.S. Cl.
CPC ............... *H01G 4/35* (2013.01); *H01G 4/2325* (2013.01); *H01G 4/30* (2013.01); *H05K 3/3442* (2013.01); *H05K 2201/10015* (2013.01)

(58) Field of Classification Search
CPC .......... H01G 4/35; H01G 4/30; H01G 4/2325
See application file for complete search history.

(56) References Cited

U.S. PATENT DOCUMENTS

| | | | | |
|---|---|---|---|---|
| 4,604,676 A | * | 8/1986 | Senda | ................... H01G 4/2325 |
| | | | | 361/309 |
| 6,356,430 B1 | * | 3/2002 | Yoshida | ................ H01L 41/047 |
| | | | | 361/303 |
| 7,352,563 B2 | | 4/2008 | Pelcak et al. | |

(Continued)

FOREIGN PATENT DOCUMENTS

| | | |
|---|---|---|
| CN | 1231487 | 10/1999 |
| CN | 1311513 | 9/2001 |

(Continued)

OTHER PUBLICATIONS

Chinese Application for Utility Model No. 201420040193.9—Evaluation Report for Utility Model Patent dated Oct. 31, 2014.

(Continued)

*Primary Examiner* — David M Sinclair
(74) *Attorney, Agent, or Firm* — Downey Brand LLP

(57) ABSTRACT

The described embodiments relate generally to a capacitor assembly for mounting on a printed circuit board (PCB) and more specifically to designs for mechanically isolating the capacitor assembly from the PCB to reduce an acoustic noise produced when the capacitor imparts a piezoelectric force on the PCB. Termination elements in the capacitor assembly, including a porous conductive layer in the capacitor assembly may reduce an amount of vibrational energy transferred from the capacitor to the PCB. Termination elements including a soft contact layer may also reduce the amount of vibrational energy transferred to the PCB. Further, capacitor assemblies having thickened dielectric material may reduce the amount of vibrational energy transferred to the PCB.

20 Claims, 13 Drawing Sheets

(56) References Cited

U.S. PATENT DOCUMENTS

| | | | |
|---|---|---|---|
| 8,553,390 B2 * | 10/2013 | Taniguchi | H01G 4/005 361/303 |
| 2001/0002505 A1 | 6/2001 | Ozasa | |
| 2001/0017420 A1 | 8/2001 | Iwao et al. | |
| 2001/0030493 A1 | 10/2001 | Noda et al. | |
| 2001/0043454 A1 * | 11/2001 | Yoshii | H01G 4/232 361/321.2 |
| 2003/0099085 A1 * | 5/2003 | Duva | 361/311 |
| 2004/0160751 A1 | 8/2004 | Inagaki et al. | |
| 2010/0033938 A1 | 2/2010 | Kitagawa et al. | |
| 2010/0071944 A1 | 3/2010 | Endo | |
| 2010/0157507 A1 * | 6/2010 | Matsumoto et al. | 361/306.3 |
| 2011/0024175 A1 * | 2/2011 | Satou | 174/260 |
| 2011/0102969 A1 * | 5/2011 | Togashi | H01G 4/012 361/306.3 |
| 2011/0157767 A1 * | 6/2011 | Hur et al. | 361/305 |
| 2012/0019099 A1 * | 1/2012 | Sato et al. | 310/311 |
| 2012/0268875 A1 | 10/2012 | Ahn et al. | |
| 2012/0275081 A1 | 11/2012 | Ahn et al. | |
| 2013/0020905 A1 | 1/2013 | Sawada et al. | |
| 2013/0050894 A1 | 2/2013 | Ahn et al. | |

FOREIGN PATENT DOCUMENTS

| | | | |
|---|---|---|---|
| CN | 1314686 | | 9/2001 |
| CN | 101246777 | | 8/2008 |
| CN | 101611493 | | 12/2009 |
| CN | 102610387 | | 7/2012 |
| JP | 61121205 A | * | 6/1986 |
| JP | 03129810 A | * | 6/1991 |
| JP | 06084687 A | * | 3/1994 |
| JP | 06176954 | | 6/1994 |
| JP | 2000223357 | | 8/2000 |
| JP | 2002100876 | | 4/2002 |
| JP | 2006028571 | | 2/2006 |
| JP | 2006186316 A | * | 7/2006 |
| JP | 2012094671 | | 5/2012 |

OTHER PUBLICATIONS

PCT Application No. PCT/US2013/073942—International Search Report & Written Opinion dated Mar. 31, 2014.
Taiwanese Patent Application No. 102149116—Office Action dated May 18, 2015.

* cited by examiner

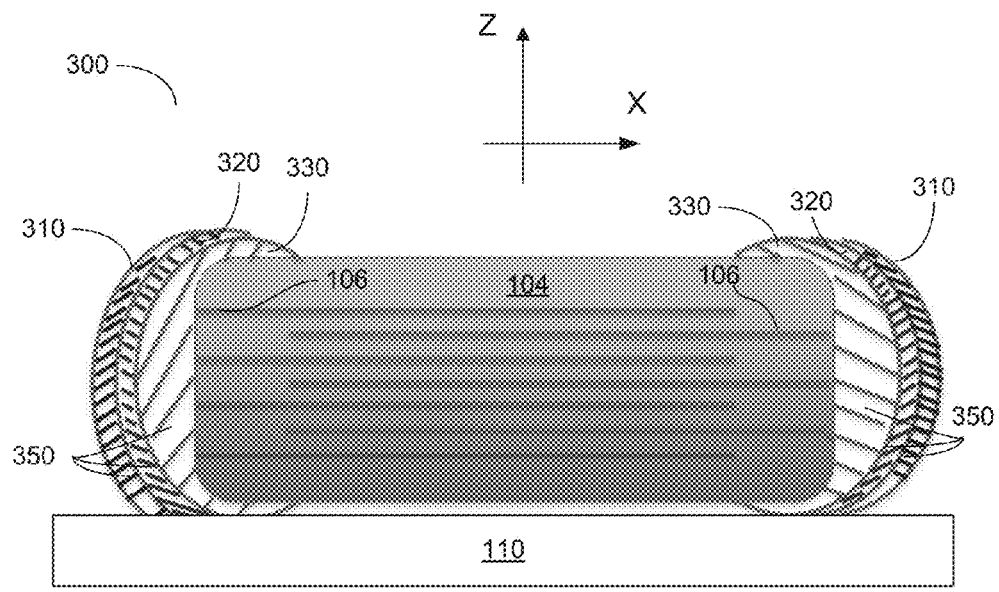
FIG. 3A
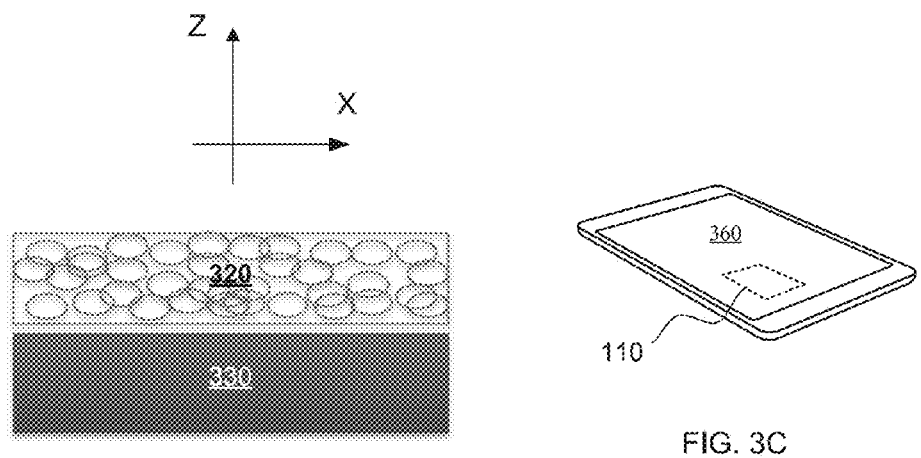
FIG. 3B
FIG. 3C

LOW ACOUSTIC NOISE CAPACITORS

CROSS-REFERENCE TO RELATED APPLICATIONS

This application claims the benefit of U.S. Provisional Patent Application No. 61/759,935, filed Feb. 1, 2013 and entitled "LOW ACOUSTIC NOISE CAPACITORS" by ARNOLD, et al., which is incorporated herein by reference in its entirety for all purposes.

FIELD OF THE DESCRIBED EMBODIMENTS

The described embodiments relate generally to printed circuit boards (PCBs) including a capacitor assembly and more specifically to designs for mechanically isolating the capacitor assembly from the PCB to reduce an acoustic noise produced when the capacitor assembly imparts an oscillating piezoelectric force on the PCB.

BACKGROUND

Printed circuit boards (PCBs) are commonly found in a variety of electronic devices, including computers, televisions and mobile devices. PCBs commonly include capacitors mounted to the PCB in order to perform a variety of functions. A capacitor can include two conductive plates separated by a dielectric such as ceramic. Certain classes of ceramic capacitors can exhibit a characteristic called piezoelectricity that can cause an internal generation of a mechanical strain in the ceramic resulting from an applied electrical field. The magnitude of the generated strain can be proportional to the strength of the electrical field, or the voltage difference applied across two conductors placed on either end of the ceramic material. When the capacitor is placed in an AC circuit, the ceramic within the capacitor can expand and contract at a frequency approximately equal to that of the AC supply.

This motion can cause several problems. First, if a capacitor is mechanically coupled to a membrane such as a PCB, these expansions and contractions can apply a periodic force on the PCB. As a result, the entire PCB can vibrate at a harmonic frequency of the power supply. The effect can be particularly pronounced when the driving frequency is approximately equal to the resonate frequency of the PCB. The vibration of the PCB can also create acoustic sound waves. In some situations, the resulting sound waves can have enough amplitude to be heard by a user of a device. Secondly, excessive vibrations can weaken solder joints and other electrical connections on the PCB, increasing the likelihood that the device will fail.

Therefore, what is desired is a reliable way to mechanically couple a capacitor to a PCB while reducing an amount of vibrational energy that is transferred from the capacitor to the PCB.

SUMMARY OF THE DESCRIBED EMBODIMENTS

The present disclosure describes embodiments for a capacitor assembly to reduce an amount of vibrational energy transferred to a PCB upon which the assembly is mounted. In one embodiment, the capacitor assembly includes a dielectric portion; a first electrode on a surface of the dielectric portion; a first termination element electrically coupled to the first conducting electrode; a second electrode on the surface of the dielectric portion; and a second termination element electrically coupled to the second conducting electrode. Accordingly, the first and second termination elements may further include a contact layer; a porous layer; and a metal-dielectric termination layer.

In another embodiment a method for manufacturing a capacitor assembly is described. The method may include forming a metal termination layer on the ends of a capacitor; depositing a conducting material on the metal termination layer and depositing a precursor on a surface of the conducting material. The method may also include forming a conducting alloy layer; generating a plurality of pores in the conducting alloy layer to form a porous layer; and depositing a conducting material on the porous layer.

In some embodiments a capacitor assembly as disclosed herein may include a dielectric portion; a first electrode embedded within the dielectric portion and a first termination element electrically coupled to the first conducting electrode. Further, the capacitor assembly may include a second electrode embedded within the dielectric portion; and a second termination element electrically coupled to the second conducting electrode. Accordingly, the dielectric portion has a thickness larger than a thickness overlapping the first electrode and the second electrode.

Further according to some embodiments a method for forming a capacitor assembly may include forming a stack of electrode layers embedded within a dielectric material and forming a dielectric layer adjacent to the stack of electrode layers. The method may also include forming a termination element in electrical contact with at least one of the electrode layers.

In some embodiments, a method for forming a capacitor assembly may include forming dielectric and electrode layers and forming a soft termination layer for electrically coupling the electrode layers. The method may also include depositing a conducting material on the soft termination layers to provide a voltage difference to the capacitor assembly. The method may include forming a dielectric portion having electrode plates forming capacitor connections; increasing the thickness of top and/or bottom ceramic portion; and terminating the capacitor connections for electrically coupling the capacitor to a PCB. In some embodiments the method also includes performing a first stacking phase; performing a second stacking phase; and performing lamination on the two stacks.

In yet other embodiments, a method of forming a capacitor assembly includes stacking the electrode and dielectric layers to the targeted height; and dicing the top ceramic layers at specified location to the specified depth.

Other aspects and advantages of embodiments disclosed herein will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

FIG. 3A shows a capacitor assembly to minimize acoustic noise, according to some embodiments.

FIG. 3B shows a partial view of a termination element in a capacitor assembly to minimize acoustic noise, according to some embodiments.

FIG. 3C illustrates an electronic device that includes a printed circuit board (PCB) with a ceramic capacitor, as discussed herein.

In the figures, elements referred to with the same or similar reference numerals include the same or similar structure, use, or procedure, as described in the first instance of occurrence of the reference numeral.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

PCBs including ceramic capacitors can be found in a wide range of electronic devices. In particular, a handheld electronic device 360, as provided in FIG. 3C, may include a PCB 110 with multiple ceramic capacitors. When an alternating electric field is applied across a ceramic capacitor, an alternating mechanical strain can be generated within the ceramic material. The strain may be the result of intrinsic piezoelectric properties of the dielectric material used for the capacitor assembly, and is typically exacerbated when high dielectric materials are used. Such may be the case for dielectric materials used in capacitor assemblies having reduced dimensions. Unless this motion is isolated, vibrational energy can be transferred from the capacitor to the PCB, creating an acoustic noise that can be audible to a user of a device. The typical frequencies of acoustic vibration producing audible noise range from about 20 Hz up to about 20 KHz. The amount of vibrational energy transferred to the PCB can be reduced by suitable termination elements in the capacitor assembly. Further, capacitor assemblies having additional dielectric material may reduce the amount of vibrational energy transferred to the PCB. Accordingly, the amount of force imparted on the PCB can be reduced, minimizing any acoustic noises resulting from the motion of the capacitor.

Figure 1A:
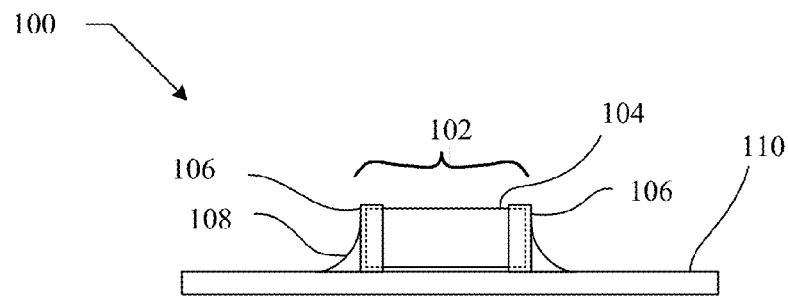
FIG. 1A shows a front view of a prior art PCB including a capacitor.

FIG. 1A shows a side view of a prior art assembly 100, including capacitor 102 coupled to PCB 110. Capacitor 102 can include two terminations 106 and dielectric 104. Terminations 106 can be formed from any conductive material such as copper or nickel or metal-glass frits. Furthermore, dielectric 104 can be formed from any suitable insulator. Ceramic is commonly used to create dielectric 104 for its high dielectric constant, stable performance at high AC frequency and low price. Capacitor 102 can be coupled to PCB 110 using solder 108. PCB 110 can include a number of substrate layers and electrical traces for electrically coupling various components mounted on PCB 110, including capacitor 102. Solder 108 can form a fillet between PCB 110 and capacitor 102, providing a strong mechanical and electrical connection between electrodes 106 and a land pattern coupled to electrical traces on PCB 110.

Figure 1B:
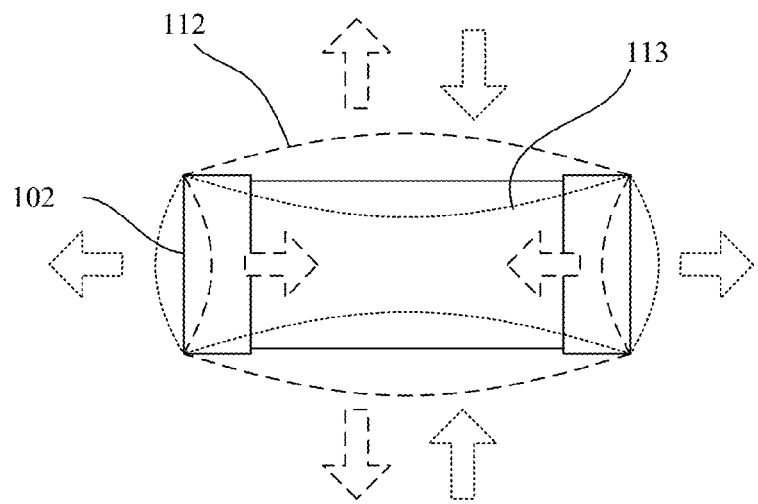
FIG. 1B shows a top view of a prior art capacitor, illustrating a typical piezoelectric displacement.

FIG. 1B shows a top view of capacitor 102, showing how internal strain may change the shape of capacitor 102 when subjected to an electric field. Capacitor 102 can include a ferroelectric material (such as a high dielectric constant X5R/X7R ceramic) for a dielectric. Ferroelectric materials can create an electrical field when subjected to strain due to an orientation of crystals within the material. This process can also work in reverse, meaning that ferroelectric materials can expand and contract when placed in an electric field. Furthermore, the magnitude of the expansion and contraction can be proportional to the strength of the electrical field. Outline 112 shows a typical manner in which capacitor 102, formed from a ferroelectric material such as ceramic, can deform in the presence of an electric field. As is shown, an upper and lower surface of capacitor 102 may bow outwards and surfaces near electrodes 106 can bow inwards. It should be noted that the amount of deformation shown in FIG. 1B is exaggerated to better express the mode by which capacitor 102 deforms. When an alternating electrical field is applied to capacitor 102, such as in the case of an AC circuit, the expansion and contraction of the ceramic material can vary along with the period of the voltage change across capacitor 102. Thus, outline 112 (dashed lines) can illustrate a typical deformation when the polarity of an applied voltage is a first state and outline 113 (dotted lines) can illustrate a typical deformation when the polarity of the applied voltage is a second state (opposite to the first state).

Figure 1C:
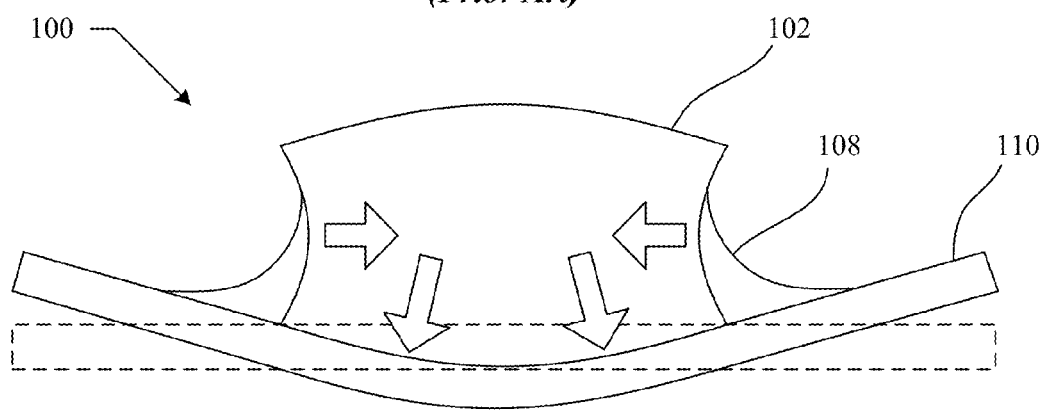
FIG. 1C shows a front view of a prior art PCB including a capacitor, illustrating how piezoelectric displacements can be transferred to the PCB.

FIG. 1C shows a front view of a prior art assembly 100, including capacitor 102 coupled to PCB 110. As in FIG. 1B, capacitor 102 is shown in a deformed state as can occur when ceramic material within capacitor 102 is under an electric field. As the voltage difference across capacitor 102 increases, the bottom surface of capacitor 102 may bow outwards, exerting a force on PCB 110. Moreover, an increase in voltage can cause the end surfaces of capacitor 102 near electrodes 106 to bow inwards, pulling on solder fillets 108. The combination of downward force on PCB 110 and pulling on solder fillets 108 can cause a downward displacement of PCB 110 in a region surrounding capacitor 102. When capacitor 102 is placed in an AC circuit, this downward displacement can vary periodically in accordance with the AC frequency. As a result, PCB 110 can vibrate at a frequency equal to the AC frequency or a harmonic of the AC frequency. The amplitude of the vibration can be particularly pronounced when a resonant frequency of PCB 110 is at or near the AC frequency or a harmonic of the AC frequency. This vibration can cause PCB 110 to act as a speaker membrane, creating an acoustic noise. In some cases, this acoustic noise can have an amplitude great enough to be audible to a user of a device.

Figure 2A:
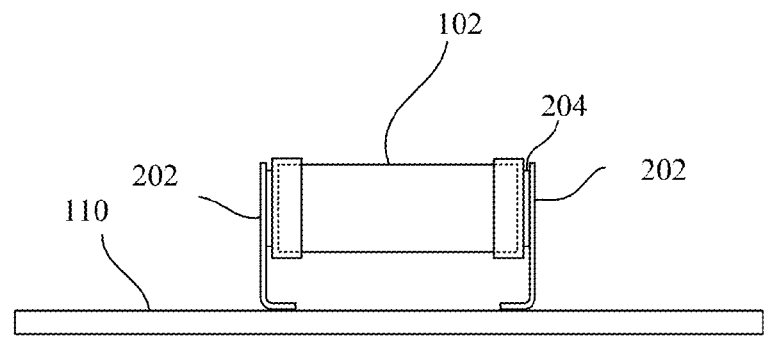
FIG. 2A shows a means of attaching a capacitor to a PCB.
Figure 2B:
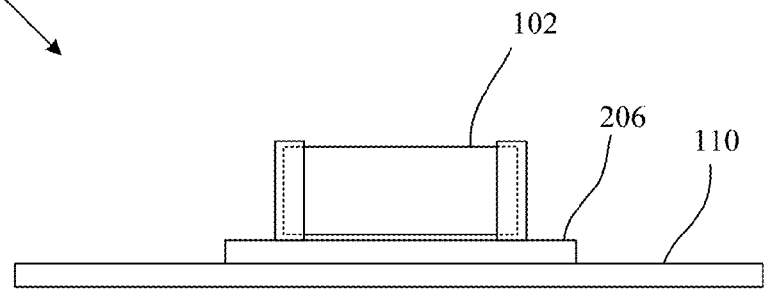
FIG. 2B shows a means of attaching a capacitor to a PCB.

FIGS. 2A and 2B show several prior art solutions for reducing an amount of vibrational energy transferred from capacitor 102 to PCB 110. In FIG. 2A, prior art assembly 200 is shown. Connectors 202 can take the form of metal connectors that can be connected to terminations 204 of capacitor 102 and coupled to PCB 110 using any number of techniques such as soldering, or welding including laser welding. Metal connectors 202 can be designed to prevent any direct contact between capacitor 102 and PCB 110 as well as absorb any mechanical vibrations transferred from the terminations of capacitor 102. However, metal connectors 202 can add a significant amount of height to assembly 200. Many modern devices, such as mobile phones, have strict space requirements for PCB assemblies that can prohibit the use of designs similar to assembly 200 to isolate capacitor 102. In FIG. 2B, prior art assembly 201 is shown. Assembly 201 can include interposer board 206 placed between capacitor 102 and PCB 110. Interposer board 206 can provide an electrical connection between electrodes on capacitor 102 and a corresponding land pattern on PCB 110. Moreover, interposer board 206 can be formed from a material designed to dampen any displacements in capacitor 102, reducing an amount of vibrational energy transferred to PCB 110. However, assembly 200 can also exceed space restrictions in many devices. Interposer board 206 can increase an area taken up by capacitor 102 on PCB 110 as well as increase the height of capacitor 102. These space increases can prevent the use of assembly 201 in many designs. Some attempts to solve the problem of acoustic noise coupled to PCB layer 110 include increasing the height of the capacitor over PCB layer 110.

Capacitor assemblies according to some embodiments disclosed herein include reinforced ceramic portions to stiffen the body of the capacitor to reduce undesired acoustic noise. Accordingly, undesired acoustic noise resulting from piezoelectric strain in the ceramic included in the capacitor assembly is damped or deflected at the component level. Thus, embodiments consistent with the present disclosure relax the conditions and constraints for PCB footprint layout and capacitor attachment to the PCB. Embodiments consistent with the present disclosure include capacitor assemblies that direct forces generated by piezo-electrically induced strain away from the PCB, so that undesired noise is not generated, or is substantially mitigated.

FIG. 3A shows a capacitor assembly 300 to minimize acoustic noise, according to some embodiments. Assembly 300 includes a dielectric portion 104, alternating electrodes 106 embedded within dielectric portion 104, and first and second termination elements 350. First and second termination elements 350 are electrically coupled to first and second electrodes 106, respectively. Termination elements 350 provide a voltage to electrodes 106 through PCB 110. In FIG. 3A, a Cartesian coordinate system Z-X is shown with the Z-axis pointing in a 'height' direction of capacitor assembly 300 (or 'vertical' direction). While the same Cartesian system will be shown hereinafter for embodiments of capacitor assemblies consistent with the present disclosure, it should be understood that the particular orientation of the capacitor assembly relative to the coordinate axes is illustrative only. One of ordinary skill in the art will recognize that many other configurations are possible in embodiments consistent with the present disclosure.

First and second termination elements 350 may cover the entire height of capacitor assembly 300 along the Z-direction. Each of the first and second termination elements 350 includes a contact layer 310, a porous conductive layer 320, and a metal-dielectric termination layer 330. Accordingly, in some embodiments contact layer 310 is formed of a conducting material such as tin (Sn), or a tin/lead alloy (Sn/Pb) formed to a thickness. Porous layer 320 may include a porous layer of a conducting material such as nickel (Ni) or Nickel alloy. Porous layer 320 will be described in more detail with reference to FIG. 3B, below.

FIG. 3B shows a partial view of a metal-dielectric termination element 350 in a capacitor assembly to minimize acoustic noise, according to some embodiments. FIG. 3B illustrates a portion of porous layer 320 adjacent to a portion of termination layer 330. In that regard, porous layer 320 may include a (full or partial) porous cone structure as an intermediate layer between termination layer 330 and contact layer 310. Accordingly, a partially porous structure in layer 320 may ensure sufficient leaching resistance when forming the assembly. In this way, layer 320 can function as a damper/cushion/buffer to absorb the shock, minimizing acoustic coupling to the solder joint and PCB from the piezoelectric-induced strain on the capacitor. In some embodiments the porous cone structure is made of a conducting material such as Ni.

Figure 4:
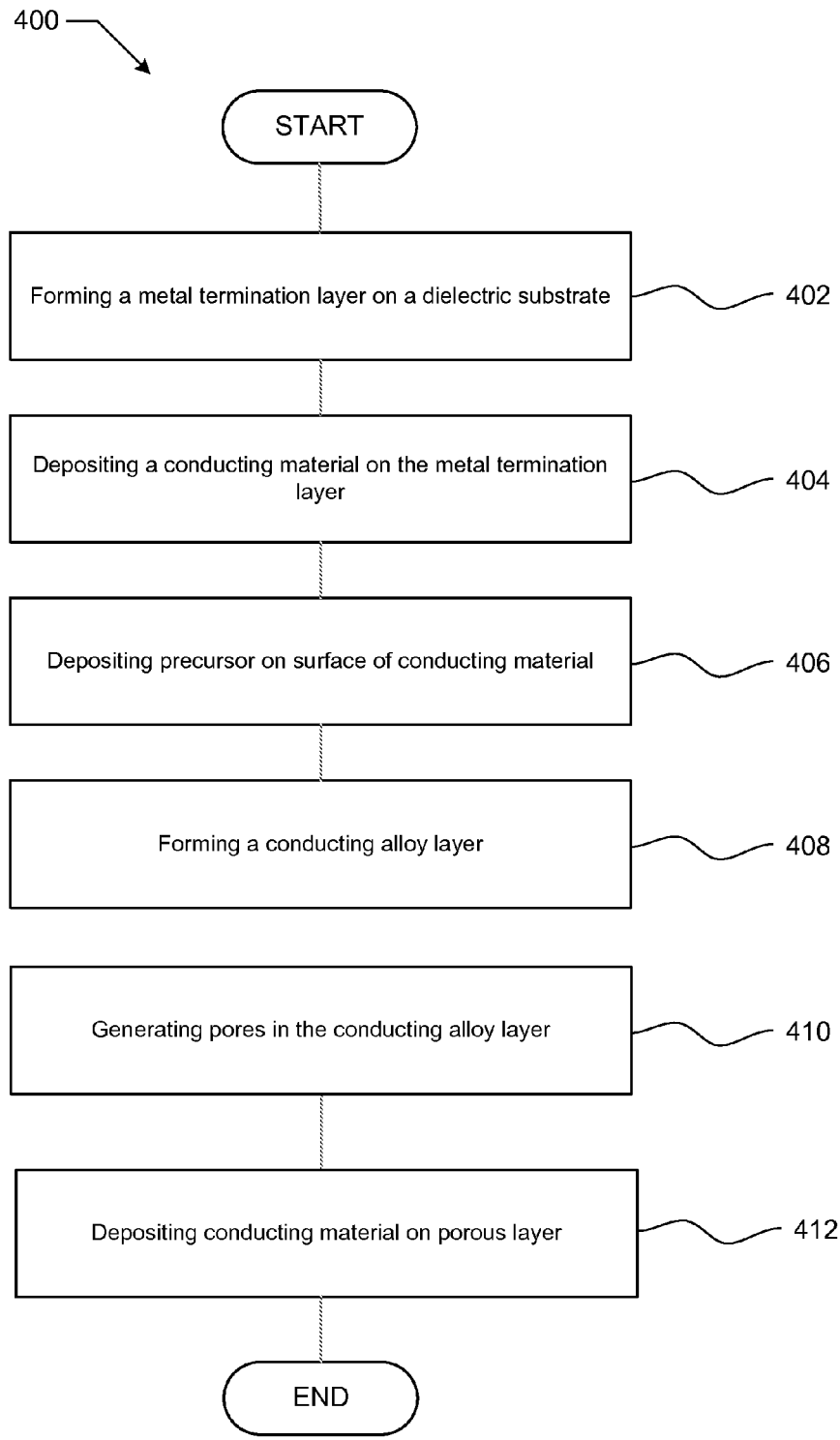
FIG. 4 shows a flow chart depicting a process of forming a capacitor assembly to minimize acoustic noise, according to some embodiments.

FIG. 4 shows a flow chart depicting a process 400 of forming a capacitor assembly to minimize acoustic noise, according to some embodiments. In some embodiments, process 400 may result in a capacitor assembly as capacitor assembly 300, described in detail above (cf. FIG. 3A).

Step 402 includes forming a metal termination layer on a dielectric substrate. In some embodiments the metal termination layer may be a metal-glass frit termination, and the dielectric substrate may be as dielectric portion 104 dielectric-electrode assembly 300 including electrode plates 106 embedded within (cf. FIGS. 3A and 3B, above). Step 404 includes depositing a conducting material on the metal termination layer of step 402. Accordingly, step 404 may include electroplating nickel over the termination layer formed in step 402, to form a layer of a pre-selected thickness. In some embodiments, step 404 may include electro-less plating nickel over the termination formed in step 402. Step 406 includes depositing a precursor material on the surface of the nickel layer formed in step 404. Accordingly, the precursor material used in step 406 may be aluminum, aluminum ink, or some other metal, or a liquid including a metal, or a liquid including an electrically conducting material. Step 408 includes forming a conducting alloy layer. In some embodiments, step 408 may include a high temperature sinter step to form a nickel-aluminum alloy. Step 410 includes generating pores in the conducting alloy layer to form a porous layer. Accordingly, step 410 may include a selective leaching step to remove aluminum from the conducting alloy layer formed in step 408. Step 412 includes depositing a conducting material on the porous layer formed in step 410. In some embodiments step 412 includes depositing Sn or Sn/Pb alloy on the porous structure resulting from step 410.

Figure 5A:
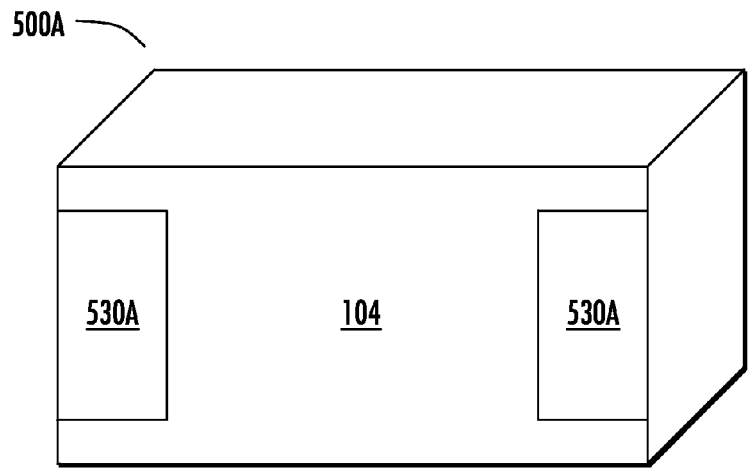
FIG. 5A shows an electrode termination layer in a capacitor assembly to minimize acoustic noise, according to some embodiments.

FIG. 5A shows electrode termination layer 530A in a capacitor assembly 500A to minimize acoustic noise, according to some embodiments. Accordingly, electrode termination layer 530A may include a soft Cu termination layer. Electrode termination layers 530A are formed on a surface of dielectric layer 104 and are electrically coupled to electrode plate 106 (cf. FIGS. 1-3, above). In some embodiments, electrode termination layers 530A are formed by plating or sputtering a Cu layer on dielectric layer 104. In some embodiments, Sn or Sn/Pb alloy is deposited on termination layers 530A to make it surface mountable to PCB layer 110.

Figure 5B:
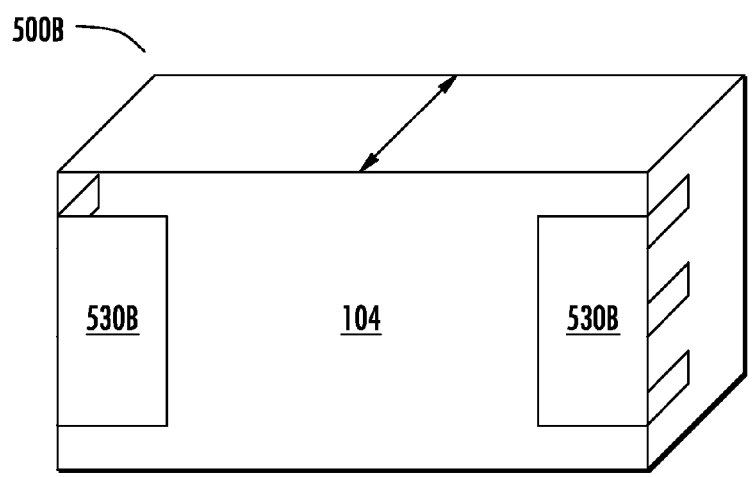
FIG. 5B shows an electrode termination layer in a capacitor assembly to minimize acoustic noise, according to some embodiments.

FIG. 5B shows electrode termination layers 530B in a capacitor assembly 500B to minimize acoustic noise, according to some embodiments. Electrode termination layers 530B include a soft Cu termination layer as in electrodes 530A (cf. FIG. 5A), further having geometrical extensions or 'fingers' into dielectric portion 104 to electrically couple electrode plates 106. The size and shape of the soft Cu termination as in electrode termination layer 530B is controlled to form a pattern for a selected size of the solder joint. In some embodiments, Sn or Sn/Pb alloy is deposited on termination layers 530A to make it surface mountable to PCB layer 110. Thus, in some embodiments electrode termination layer 530B together with a top coating of Sn or Sn/Pb forms a reduced solder joint providing sufficient electrical conductivity and limited mechanical coupling from the capacitor assembly into the PCB.

In some embodiments, electrode termination layers 530A may be formed on a plane parallel to the plane of PCB layer 110 and 530B may be formed on a plane perpendicular to the plane of PCB layer 110. That is, in some embodiments the plane within dielectric portion 104 on which electrodes 106 are formed may be parallel to the Z-axis (cf. FIGS. 3A and 3B).

Figure 6:
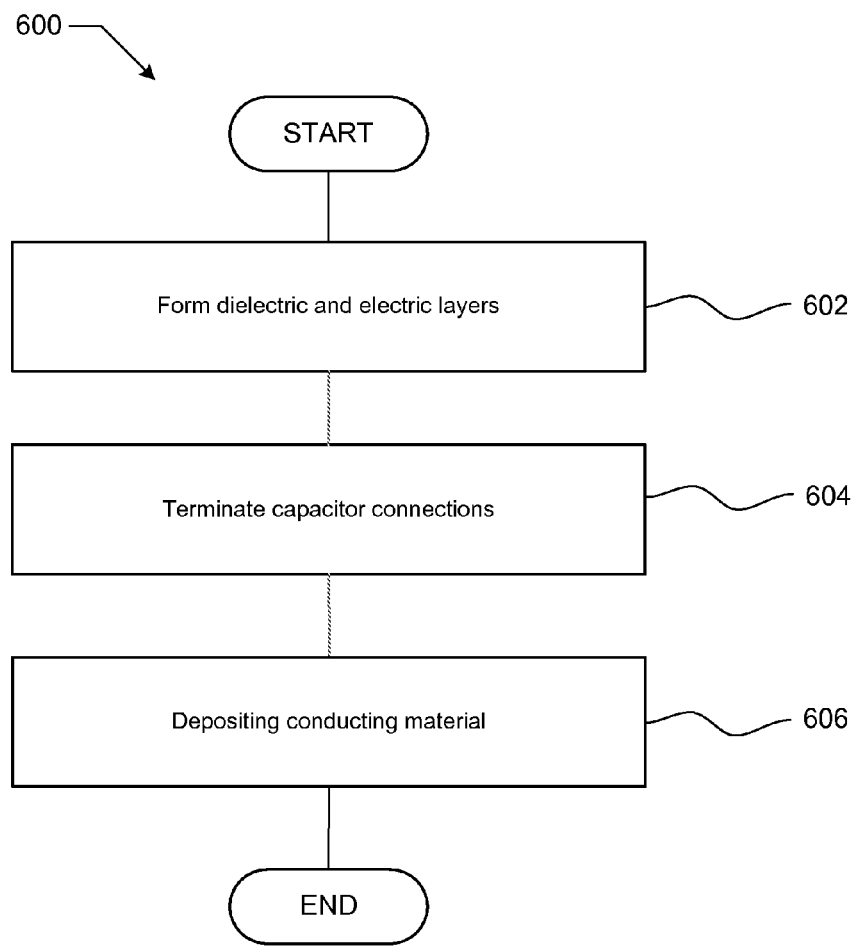
FIG. 6 shows a flow chart depicting a process of forming a capacitor assembly to minimize acoustic noise, according to some embodiments.

FIG. 6 shows a flow chart depicting a process 600 of forming a capacitor assembly to minimize acoustic noise, according to some embodiments. Accordingly, process 600 may be used to form a capacitor assembly like assembles 500A and 500B, described in detail above (cf. FIGS. 5A and 5B).

Step 602 includes forming dielectric and electric layers. For example, step 602 may include forming dielectric and electric layers as dielectric portion 104 including electrode plates 106 (cf. FIG. 3A).

Step 604 includes terminating capacitor connections in the capacitor assembly. Step 604 may include forming a soft metal termination layer for electrically coupling the electric layers formed in step 602. In some embodiments step 604 includes depositing a conducting material on a surface of the dielectric and electric layers formed in step 602 (e.g., termination layers 530A and 530B, cf. FIGS. 5A and 5B). For example, step 604 may include electroplating or electro-less plating deposition materials for terminating the capacitor connections. Step 604 may also include forming a pattern with an internal electrode. In some embodiments, step 604 may include forming a pattern such as in electrode termination layer 530B. Step 606 includes depositing Sn or Sn/Pb alloy on the terminated capacitor connections in step 604.

Figure 7A:
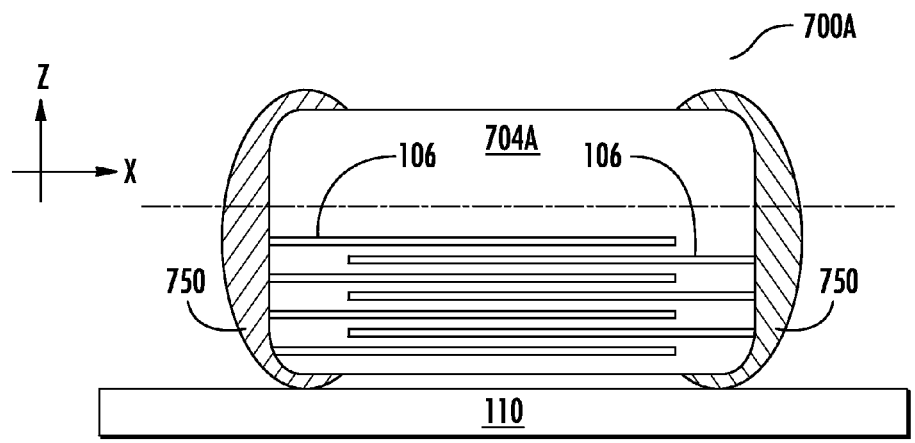
FIG. 7A shows a capacitor assembly to minimize acoustic noise, according to some embodiments.

FIG. 7A shows capacitor assembly 700A to minimize acoustic noise, according to some embodiments. Assembly 700A includes dielectric portion 704A having an extended height in the Z-direction. Accordingly, the extended height of portion 704A includes additional dielectric material above the portion including electrode plates 106. Furthermore, assembly 700A includes termination elements 750 covering the entire height along the Z-direction of capacitor assembly 704A.

Figure 7B:
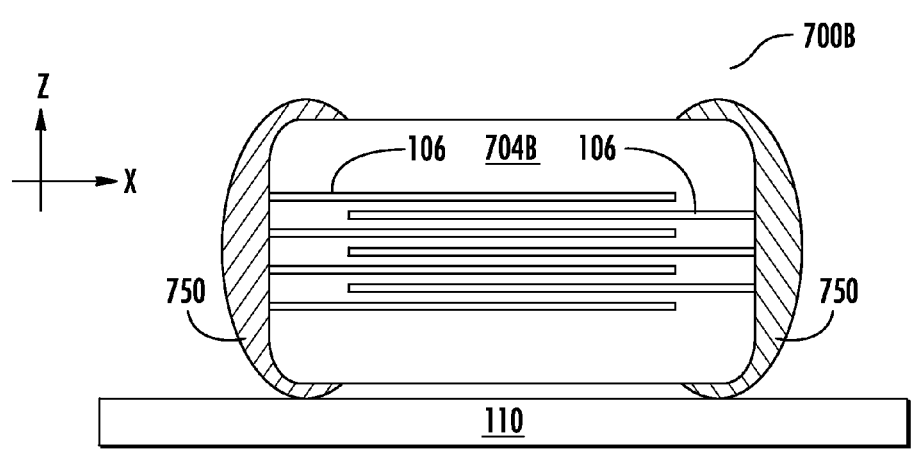
FIG. 7B shows a capacitor assembly to minimize acoustic noise, according to some embodiments.

FIG. 7B shows capacitor assembly 700B to minimize acoustic noise, according to some embodiments. Assembly 700B includes dielectric portion 704B having an extended height in the Z-direction. Accordingly, the extended height of portion 704B includes additional dielectric material above and below the portion overlapping electrode plates 106. Furthermore, assembly 700B includes termination elements 750 covering the entire height along the Z-direction of capacitor assembly 704B.

Figure 7C:
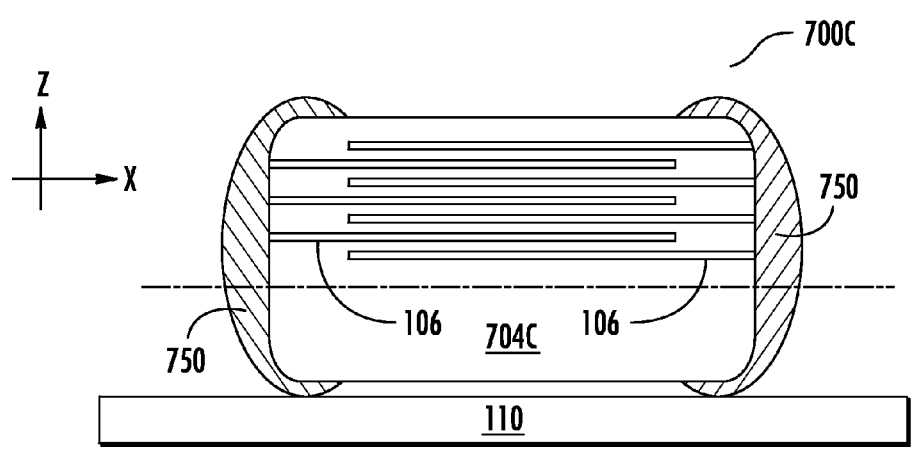
FIG. 7C shows a capacitor assembly to minimize acoustic noise, according to some embodiments.

FIG. 7C shows capacitor assembly 700C to minimize acoustic noise, according to some embodiments. Assembly 700C includes dielectric portion 704C having an extended height in the Z-direction. Accordingly, the extended height of portion 704C includes additional dielectric material below the portion including electrode plates 106. Furthermore, assembly 700C includes termination elements 750 covering the entire height along the Z-direction of capacitor assembly 704C.

The thickened dielectric layers 704A, 704B, and 704C can restrict the strain of the capacitor assembly along the Z-direction, as the dielectric layer is piezo-electrically strained by the applied electric field. Thus, mechanical coupling into PCB layer 110 is reduced in embodiments consistent with the present disclosure.

Figure 8:
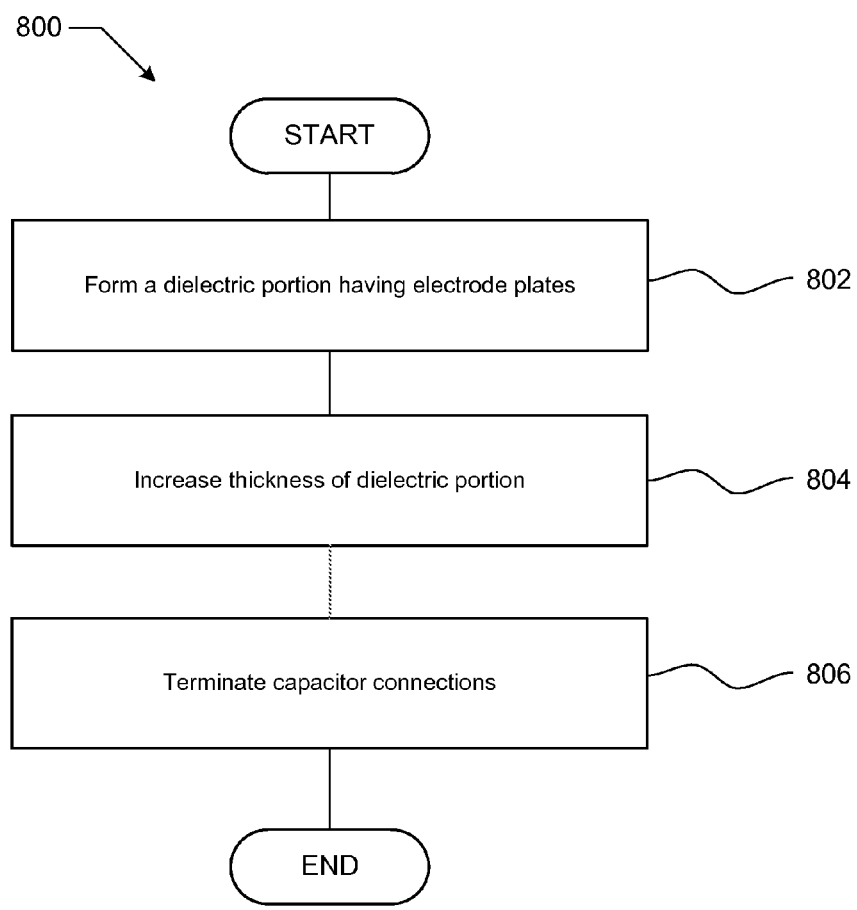
FIG. 8 shows a flow chart depicting a process of forming a capacitor assembly to minimize acoustic noise, according to some embodiments.

FIG. 8 shows a flow chart depicting a process 800 of forming a capacitor assembly to minimize acoustic noise, according to some embodiments. Step 802 includes forming a dielectric portion having electrode plates forming capacitor connections. Accordingly, step 802 may include forming a dielectric portion such as portions 704A, 704B, and 704C discussed in detail above (cf. FIGS. 7A-7C). Step 804 includes increasing the thickness of the dielectric portion. Step 806 includes terminating capacitor connections in the capacitor assembly. In some embodiments, step 806 may include steps 604 and 606, described in detail above (cf. FIG. 6). Furthermore, in some embodiments step 806 may include forming termination elements covering the entire height of the capacitor assembly (cf. termination elements 750, FIGS. 7A-7C).

Figure 9A:
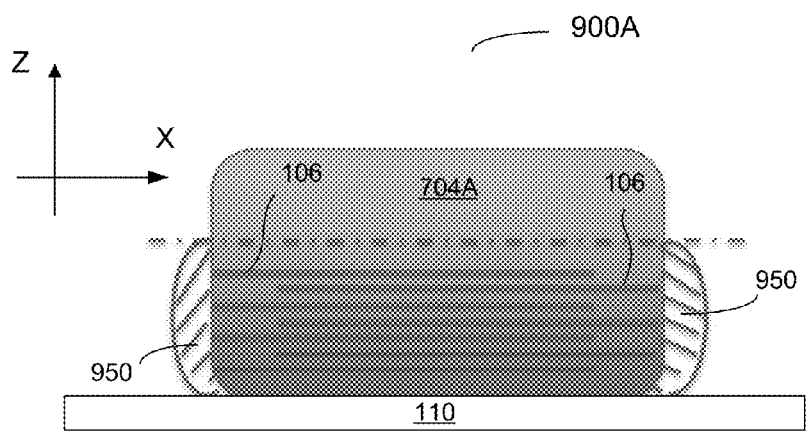
FIG. 9A shows a capacitor assembly to minimize acoustic noise, according to some embodiments.

FIG. 9A shows a capacitor assembly 900A to minimize acoustic noise, according to some embodiments. Assembly 900A includes dielectric portion 704A having an extended height in the Z-direction. Accordingly, the extended height of portion 704A is above the portion overlapping electrodes 106. Furthermore, assembly 900A includes termination elements 950 covering a partial height along the Z-direction overlapping electrodes 106.

Figure 9B:
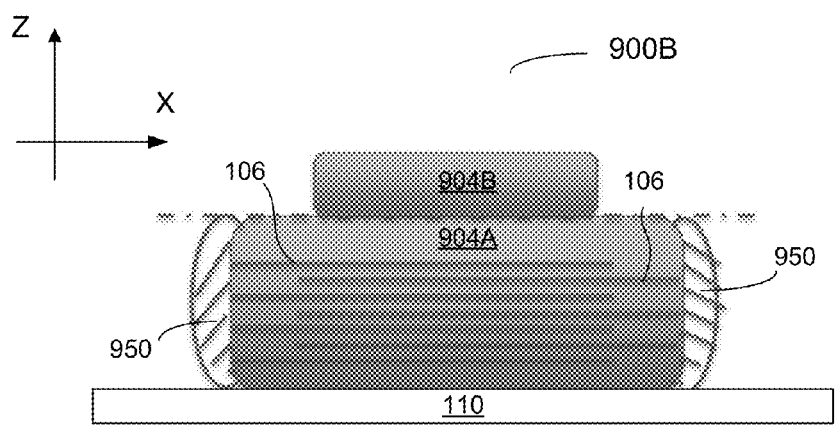
FIG. 9B shows a capacitor assembly to minimize acoustic noise, according to some embodiments.

FIG. 9B shows a capacitor assembly 900B to minimize acoustic noise, according to some embodiments. Assembly 900B includes dielectric portion 904B adjacent to dielectric portion 904A. Dielectric portion 904A includes electrodes 106, and dielectric portion 904B extends the height of the dielectric material in the Z-direction. Assembly 900A includes termination elements 950 covering the entire height of dielectric portion 904A. According to some embodiments, dielectric portion 904B has a reduced lateral dimension (along the X-direction) relative to dielectric portion 904A. This ensures that termination wraps up a capacitor for better adhesion.

Embodiments as illustrated in FIGS. 9A and 9B provide a reduced acoustic coupling into PCB 110 as the thickened dielectric layer (or layers, as in assembly 900B) has limited strain along the Z-direction. In some embodiments assemblies 900A and 900B also provide a reduced termination element 950 including a wrap-up structure providing good termination adhesion. A reduced size of termination elements 950 may be desirable to simplify manufacturing steps.

Figure 10A:
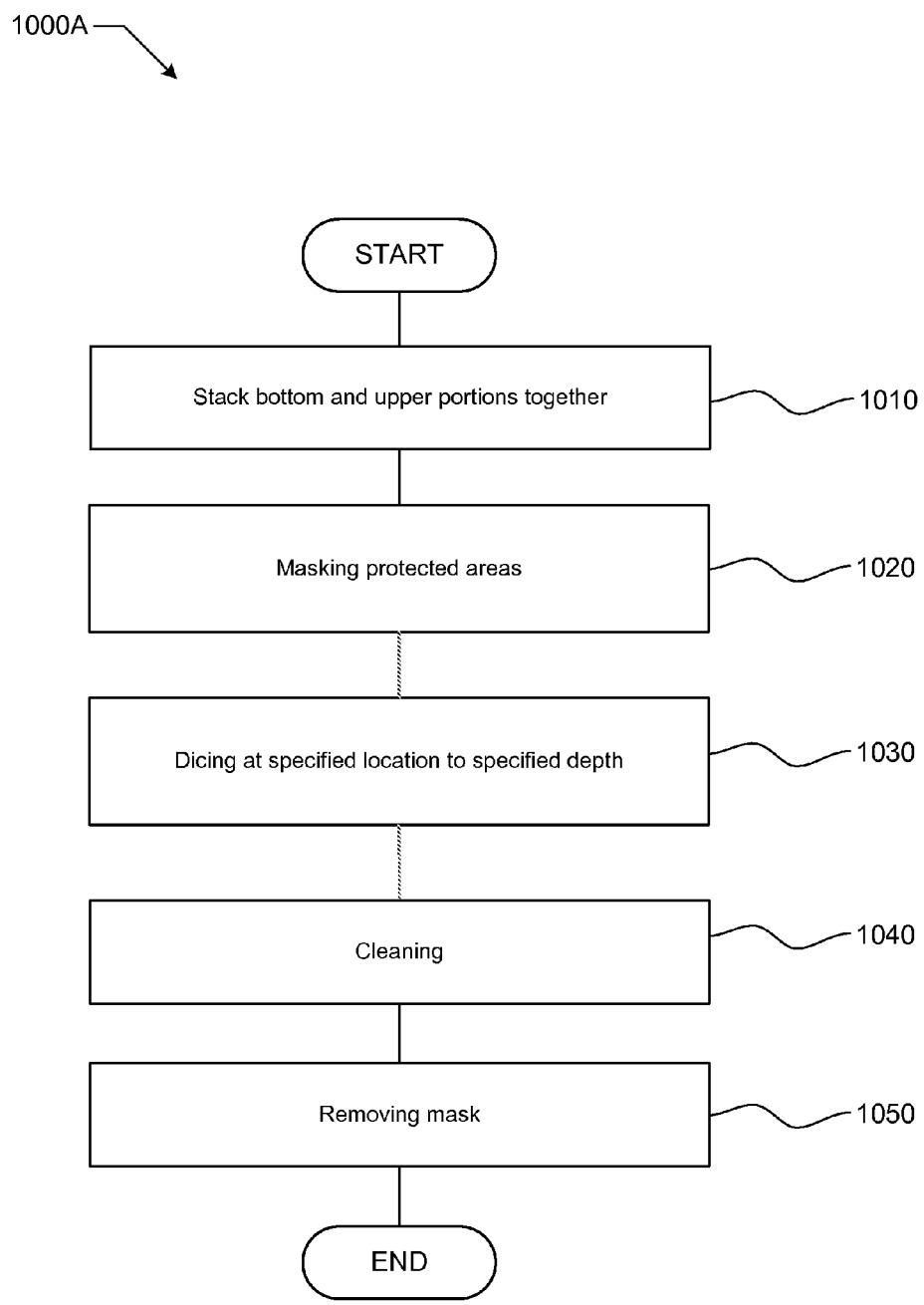
FIG. 10A shows a flow chart depicting a process of forming a capacitor assembly to minimize acoustic noise, according to some embodiments.

FIG. 10A shows a flow chart depicting a process 1000A of forming a capacitor assembly to minimize acoustic noise, according to some embodiments. For example, steps in process 1000 may result in capacitor assembly 900B, described in detail above (cf. FIG. 9B).

Step 1010 includes a stacking phase for a bottom and a top portion of a capacitor assembly. A bottom portion may be as portion 904A and a top portion may be as portion 904B in capacitor assembly 900B, described in detail above (cf. FIG. 9B). Thus, step 1010 may include performing partially or totally any one of steps 402-412 in process 400, steps 602-608 in process 600, steps 802-804 in process 800, or any combination thereof. For example, step 1010 may include interleaving conducting layers and dielectric material, the conducting layers forming electrodes in the capacitor assembly. Step 1020 includes masking certain area of the top layer of the dielectric material created in step 1010 (e.g., portion 904B, cf. FIG. 9B). Step 1020 ensures that masked areas are unaffected by the subsequent dicing/cutting step 1030. Step 1030 includes dicing or cutting the top layer of the resulting stack in step 1010 at the uncovered locations. Thus, decreasing the lateral dimensions (X-axis) of a top portion in the assembly (e.g. portion 904B, cf. FIG. 9B), relative to a bottom portion (e.g., portion 904A, cf. FIG. 9B). Step 1040 includes cleaning residuals of dicing and cutting in step 1030. Step 1050 includes removing the mask used in step 1020.

Figure 10B:
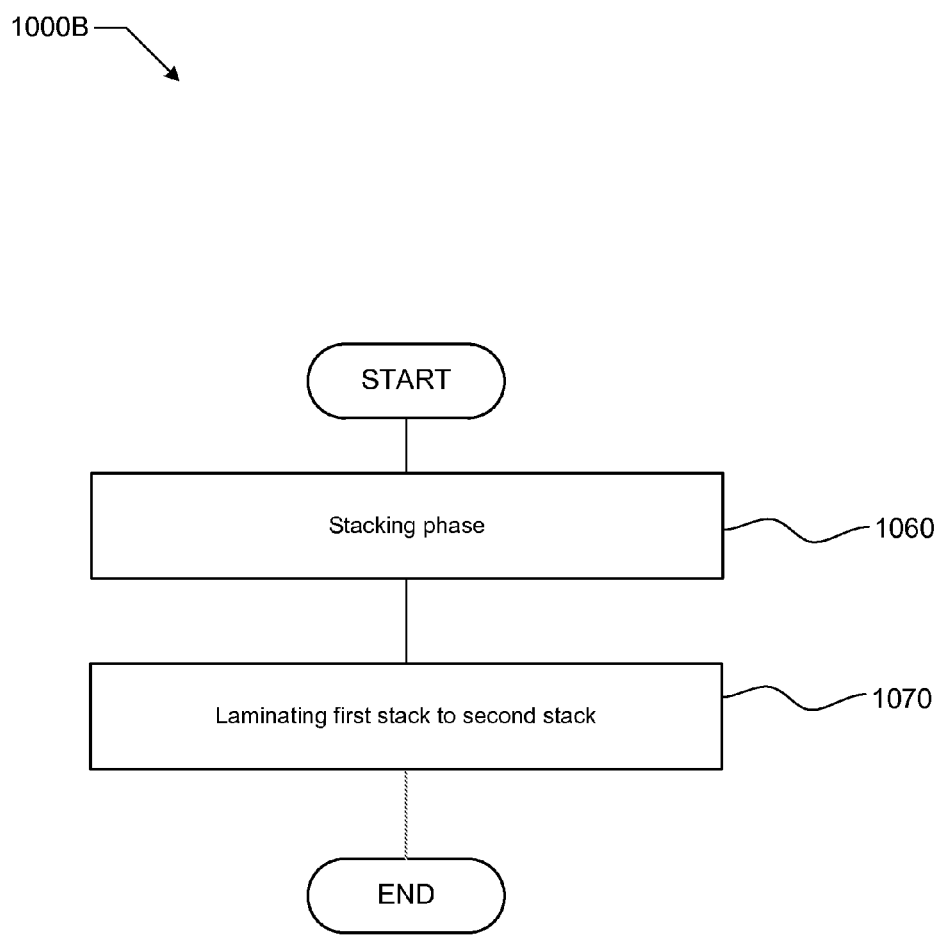
FIG. 10B shows a flow chart depicting a process of forming a capacitor assembly to minimize acoustic noise, according to some embodiments.

FIG. 10B shows a flow chart depicting a process 1000B of forming a capacitor assembly to minimize acoustic noise, according to some embodiments. For example, steps in process 1000 may result in capacitor assembly 900B, described in detail above (cf. FIG. 9B).

Step 1060 includes a stacking phase. Step 1060 may include forming a stack of conductive layers embedded in dielectric material as described in detail above (e.g., portion 904A, cf. FIG. 9A). Step 1060 may also include forming a dielectric layer having no electrode material embedded in it (e.g., portion 904B). The height of the stack overlapping the conductive layers reflects the termination height (e.g., termination elements 950, cf. FIG. 9B). Thus, step 1010 may include performing partially or totally any one of steps 402-412 in process 400, steps 602-608 in process 600, steps 802-804 in process 800, or any combination thereof. For example, a phase of stacking dielectric layers may include interleaving conducting layers and dielectric material, the conducting layers forming electrodes in the capacitor assembly. Step 1070 includes laminated the first stack including conductive layers to the second dielectric stack, as formed in step 1010. For example, step 1070 may include laminating portion 904A and portion 904A, resulting in capacitor assembly 900B (cf. FIG. 9B).

Step 1070 may include laminating the first stack above, below, or above and below the second stack formed in step 1060. Furthermore, the shape and size of the first stack may be different from the shape and size of the second stack formed in step 1060. Moreover, in some embodiments the first stack and the second stack formed in step 1010 may have different shape and size. Thus, in some embodiments the capacitor assembly resulting from process 1000B may have an asymmetric profile along the Z-axis. In some embodiments, the capacitor assembly resulting from process 1000B may have a symmetric profile along the Z-axis. Having a capacitor assembly with a symmetric profile along the Z-direction may be desirable to reduce the risk of cracks formed during sintering steps or due to thermal shock naturally occurring during device operation.

Figure 11:
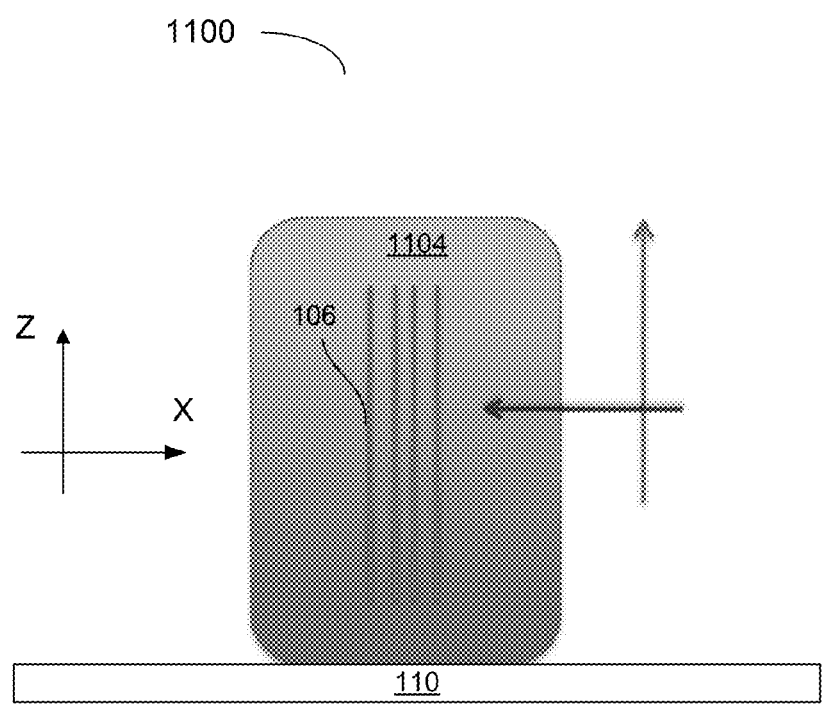
FIG. 11 shows a capacitor assembly to minimize acoustic noise, according to some embodiments.

FIG. 11 shows a side view of a capacitor assembly 1100 to minimize acoustic noise, according to some embodiments. Capacitor assembly 1100 includes sidewalls that are thickened along the height, or Z-direction. Accordingly, the thickened side wall(s) restrict the acoustic coupling into PCB layer 110 as dielectric layer 1104 is strained by the electric field. In that regard, electrode plates 106 may be formed in a direction substantially perpendicular to the PCB plane. Accordingly, in some embodiments the electric field is substantially parallel to the plane of PCB layer 110. The termination elements to electrically couple electrode plates 106 can be metal-glass frit termination as per existing processes or a soft Cu termination (e.g., termination layers 530A and 530B, cf. FIGS. 5A and 5B), or a combination thereof. A porous nickel layer (e.g., termination element 350, cf. FIG. 3A) may be also added.

Figure 12:
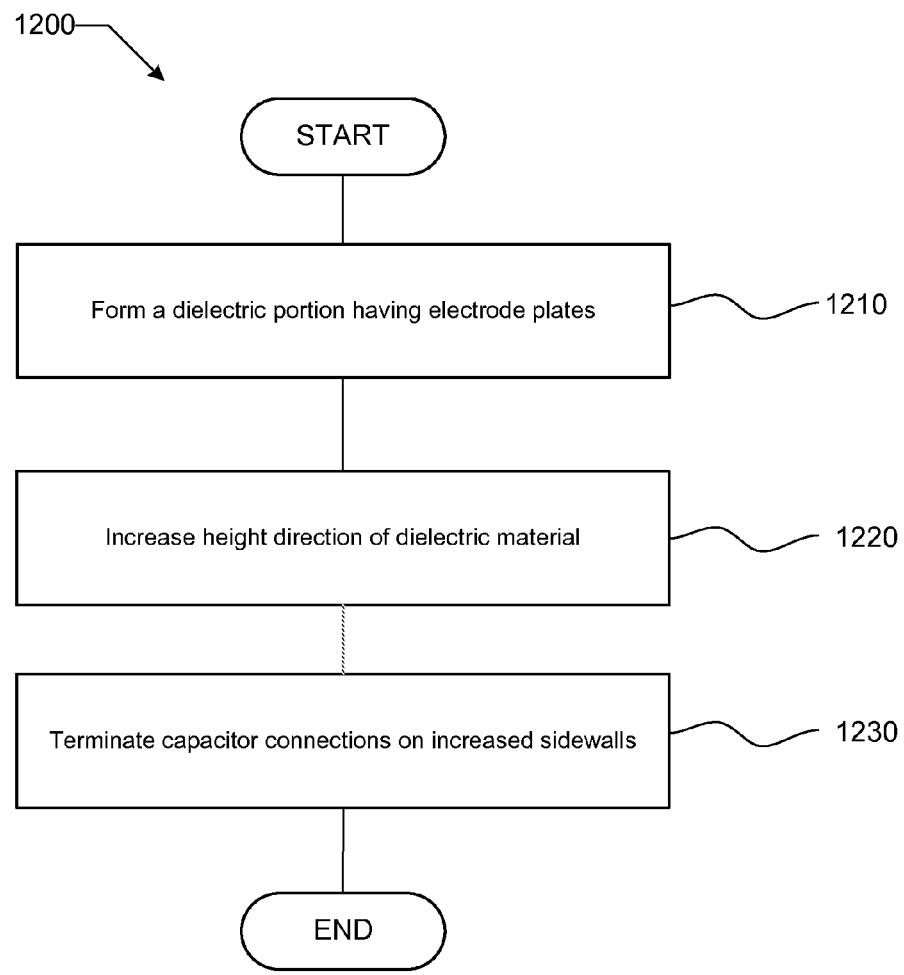
FIG. 12 shows a flowchart depicting a process of forming a capacitor assembly to minimize acoustic noise, according to some embodiments.

FIG. 12 shows a flowchart depicting a process 1200 of forming a capacitor assembly to minimize acoustic noise, according to some embodiments. For example, steps in process 1200 may result in capacitor assembly 1100, described in detail above (cf. FIG. 11). Step 1210 includes forming a dielectric portion having electrode plates. Accordingly, step 1210 may be as step 802, described in detail above (cf. FIG. 8). Step 1220 includes increasing height dimension of the dielectric material. Step 1230 includes terminating capacitor connections on increased sidewalls.

Embodiments consistent with capacitor assemblies 700A, 700B, 700C (cf. FIGS. 7A-7C) 900A, 900B (cf. FIGS. 9A-9B), and 1100 (cf. FIG. 11) may include additional dielectric material non-overlapping the area with electrode plates 106. This additional dielectric material may have a limited effect in the electromagnetic performance of the capacitor assembly, and a strong effect in mitigating mechanical coupling of the device into PCB layer 110. Accordingly, some embodiments may include between approximately 15% and approximately 50% of additional dielectric material relative to the amount of dielectric material including electrode plates 106. One of ordinary skill in the art will recognize that the amount of additional dielectric material may vary according to a desired outcome in terms of materials processing, cost, and noise mitigation.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A capacitor assembly, comprising:
   a dielectric portion;
   a first electrode disposed in the dielectric portion;
   a first termination element electrically coupled to the first electrode;
   a second electrode disposed in the dielectric portion; and
   a second termination element electrically coupled to the second electrode, wherein each of the first termination element and the second termination element includes:
   an outermost conductive contact layer;
   an innermost metal-glass termination layer; and
   a porous nickel-aluminum alloy conductive layer that includes a conical porous structure and is directly between the outermost conductive contact layer and the innermost metal-glass termination layer.

2. The capacitor assembly of claim 1, wherein the dielectric portion has a thickness larger than a vertical thickness along a height direction, wherein the vertical thickness includes the first electrode and the second electrode.

3. The capacitor assembly of claim 1, wherein the outermost conductive contact layer includes tin.

4. The capacitor assembly of claim 1, wherein the conical porous structure is a full or partial cone structure.

5. The capacitor assembly of claim 1, wherein the outermost conductive contact layer includes a tin and lead alloy.

6. The capacitor assembly of claim 1, wherein the conical structure is a full or partial cone structure.

7. The capacitor assembly of claim 1, wherein the porous conductive layer is a partially leached layer.

8. The capacitor assembly of claim 1, wherein the dielectric portion has an extended portion including dielectric material above and below the first and second electrodes.

9. A printed circuit board (PCB) for use in a handheld electronic device, comprising:
   an electrical component comprising:
      a dielectric portion;
      a first termination element; and
      a second termination element, wherein the first termination element and the second termination element each includes:
         an outermost conductive contact layer relative to the dielectric portion,
         an innermost metal-glass termination layer, and
         a porous nickel-aluminum alloy conductive layer that includes a conical porous structure and is directly between the outermost conductive contact layer and the innermost metal-glass termination layer.

10. The PCB of claim 9, wherein the dielectric portion of the electrical component has a horizontal thickness that is larger than a vertical thickness of the dielectric portion.

11. The PCB of claim 9, wherein each of the first termination element and the second termination element consists of three layers.

12. The PCB of claim 9, wherein the outermost conductive contact layer includes tin.

13. The PCB of claim 12, wherein the conical structure is a full or partial cone structure.

14. The PCB of claim 9, wherein the outermost conductive contact layer includes a tin and lead alloy.

15. The PCB of claim 9, wherein the dielectric portion is separated from the PCB by a gap.

16. The PCB of claim 9, wherein the electrical component includes electrodes and a majority of the electrodes of are disposed within half of the dielectric portion.

17. A portable computing device comprising:
   a printed circuit board (PCB); and
   a capacitor assembly electrically coupled to the PCB, the capacitor assembly comprising:
      a first electrode and a second electrode embedded in a dielectric region, wherein the first electrode and the second electrode are each electrically coupled to a multi-layered termination element abutting a perimeter of the dielectric region, wherein the multi-layered termination element includes:
         an outermost conductive contact layer,
         an innermost metal-glass termination layer, and
         a porous nickel-aluminum alloy conductive layer that includes a conical porous structure and is directly between the outermost conductive contact layer and the innermost metal-glass termination layer.

18. The portable computing device of claim 17, wherein at least one of the first electrode and the second electrode is formed in a direction substantially perpendicular to a substrate layer of the PCB.

19. The portable computing device of claim 17, wherein the porous conductive layer includes nickel.

20. The portable computing device of claim 19, wherein the outermost conductive contact layer includes tin.

* * * * *